(12) United States Patent
Shum et al.

(10) Patent No.: US 8,618,742 B2
(45) Date of Patent: *Dec. 31, 2013

(54) ILLUMINATION SOURCE AND MANUFACTURING METHODS

(75) Inventors: Frank Tin Chung Shum, Sunnyvale, CA (US); Clifford Jue, Santa Cruz, CA (US)

(73) Assignee: Soraa, Inc., Fremont, CA (US)

( * ) Notice: Subject to any disclaimer, the term of this patent is extended or adjusted under 35 U.S.C. 154(b) by 338 days.

This patent is subject to a terminal disclaimer.

(21) Appl. No.: 13/025,849

(22) Filed: Feb. 11, 2011

(65) Prior Publication Data

US 2011/0204779 A1    Aug. 25, 2011

(51) Int. Cl.
*G05F 1/00*    (2006.01)
*F21S 4/00*    (2006.01)

(52) U.S. Cl.
USPC ..................... 315/291; 362/249.01

(58) Field of Classification Search
USPC ................ 313/291, 307, 308, 224
See application file for complete search history.

(56) References Cited

U.S. PATENT DOCUMENTS

| | | | |
|---|---|---|---|
| 5,764,674 A | 6/1998 | Hibbs-Brenner et al. | |
| 6,501,154 B2 | 12/2002 | Morita et al. | |
| D471,881 S | 3/2003 | Hegde | |
| 6,787,999 B2 | 9/2004 | Stimac et al. | |
| 6,853,010 B2 | 2/2005 | Slater et al. | |
| 6,964,877 B2 * | 11/2005 | Chen et al. | 438/20 |
| 7,053,413 B2 | 5/2006 | D'Evelyn et al. | |
| 7,148,515 B1 | 12/2006 | Huang et al. | |
| 7,220,324 B2 | 5/2007 | Baker et al. | |
| D545,457 S | 6/2007 | Chen | |
| 7,252,408 B2 | 8/2007 | Mazzochette | |
| 7,253,446 B2 | 8/2007 | Sakuma et al. | |
| 7,338,828 B2 | 3/2008 | Imer et al. | |
| 7,344,279 B2 * | 3/2008 | Mueller et al. | 362/294 |
| D581,583 S | 11/2008 | Peng | |
| D592,613 S | 5/2009 | Plonski et al. | |
| 7,550,305 B2 | 6/2009 | Yamagata et al. | |
| 7,637,635 B2 | 12/2009 | Xiao et al. | |
| 7,658,528 B2 | 2/2010 | Hoelen et al. | |
| 7,663,229 B2 | 2/2010 | Lu et al. | |
| 7,674,015 B2 | 3/2010 | Chien | |
| D618,634 S | 6/2010 | Lin et al. | |
| 7,744,259 B2 | 6/2010 | Walczak et al. | |
| D619,551 S | 7/2010 | Lin et al. | |
| 7,824,075 B2 | 11/2010 | Maxik | |
| 7,972,040 B2 * | 7/2011 | Li et al. | 362/311.02 |
| 7,993,031 B2 | 8/2011 | Grajcar | |
| D662,899 S | 7/2012 | Shum et al. | |
| D662,900 S | 7/2012 | Shum et al. | |

(Continued)

OTHER PUBLICATIONS

U.S. Appl. No. 13/135,087 unpublished, filed Jun. 23, 2011, Trottier et al.

(Continued)

*Primary Examiner* — Douglas W Owens
*Assistant Examiner* — Amy Yang
(74) *Attorney, Agent, or Firm* — Kilpatrick Townsend & Stockton LLP

(57) ABSTRACT

A light source manufacturing method includes disposing LEDs upon a substrate having input pads for receiving an operating voltage for the LEDs, bonding a flexible PC board to the substrate, and using a thermally conductive adhesive bonding the substrate onto a planar region of a heat sink.

19 Claims, 12 Drawing Sheets

(56) References Cited

U.S. PATENT DOCUMENTS

| | | |
|---|---|---|
| 8,324,835 B2 | 12/2012 | Shum et al. |
| 2003/0058650 A1 | 3/2003 | Shih |
| 2004/0264195 A1 | 12/2004 | Chang et al. |
| 2005/0174780 A1 | 8/2005 | Park |
| 2005/0214992 A1 | 9/2005 | Chakraborty et al. |
| 2006/0065900 A1 | 3/2006 | Hsieh et al. |
| 2006/0152795 A1 | 7/2006 | Yang |
| 2006/0208262 A1 | 9/2006 | Sakuma et al. |
| 2006/0240585 A1 | 10/2006 | Epler et al. |
| 2006/0262545 A1 | 11/2006 | Piepgras et al. |
| 2007/0007898 A1 | 1/2007 | Bruning |
| 2008/0049399 A1 | 2/2008 | Lu et al. |
| 2008/0080137 A1 | 4/2008 | Otsuki et al. |
| 2008/0142781 A1 | 6/2008 | Lee |
| 2008/0158887 A1 | 7/2008 | Zhu et al. |
| 2008/0164489 A1 | 7/2008 | Schmidt et al. |
| 2008/0266866 A1 | 10/2008 | Tsai |
| 2009/0072252 A1 | 3/2009 | Son et al. |
| 2009/0134421 A1 | 5/2009 | Negley |
| 2009/0154166 A1* | 6/2009 | Zhang et al. ............. 362/294 |
| 2009/0173958 A1 | 7/2009 | Chakraborty |
| 2009/0244899 A1 | 10/2009 | Chyn |
| 2009/0315965 A1 | 12/2009 | Yamagata et al. |
| 2010/0003492 A1 | 1/2010 | D'Evelyn |
| 2010/0025656 A1 | 2/2010 | Raring et al. |
| 2010/0060130 A1 | 3/2010 | Li et al. |
| 2010/0091487 A1 | 4/2010 | Shin |
| 2010/0148145 A1 | 6/2010 | Ishibashi et al. |
| 2010/0207534 A1* | 8/2010 | Dowling et al. ............. 315/186 |
| 2010/0277068 A1 | 11/2010 | Broitzman |
| 2010/0320499 A1 | 12/2010 | Catalano et al. |
| 2011/0032708 A1 | 2/2011 | Johnston et al. |
| 2011/0056429 A1 | 3/2011 | Raring et al. |
| 2011/0140150 A1 | 6/2011 | Shum |
| 2011/0140586 A1 | 6/2011 | Wang |
| 2011/0182056 A1 | 7/2011 | Trottier et al. |
| 2011/0182065 A1 | 7/2011 | Negley et al. |
| 2011/0186874 A1 | 8/2011 | Shum |
| 2011/0186887 A1 | 8/2011 | Trottier et al. |
| 2011/0198979 A1 | 8/2011 | Shum et al. |
| 2011/0204763 A1 | 8/2011 | Shum et al. |
| 2011/0204779 A1 | 8/2011 | Shum et al. |
| 2011/0204780 A1 | 8/2011 | Shum et al. |
| 2011/0215348 A1 | 9/2011 | Trottier et al. |
| 2011/0309734 A1 | 12/2011 | Lin et al. |
| 2012/0187830 A1 | 7/2012 | Shum et al. |
| 2013/0058099 A1 | 3/2013 | Shum et al. |

OTHER PUBLICATIONS

U.S. Appl. No. 12/914,789 unpublished, filed Oct. 28, 2010, Shum.
U.S. Appl. No. 12/858,379 unpublished, filed Aug. 17, 2010, Shum.
U.S. Appl. No. 61/257,303 unpublished, filed Nov. 2, 2009, Shum.
U.S. Appl. No. 61/256,934 unpublished, filed Oct. 30, 2009, Shum.
U.S. Appl. No. 61/241,457 unpublished, filed Sep. 11, 2009, Shum.
U.S. Appl. No. 61/241,455 unpublished, filed Sep. 11, 2009, Shum.
Haskell et al., 'Defect Reduction in (1100) m-plane gallium nitride via lateral epitaxial overgrowth by hydride vapor phase epitaxy', Applied Physics Letters 86, 111917 (2005), pp. 1-3.
USPTO Office Action for U.S. Appl. No. 12/785,953 dated Apr. 12, 2012.
USPTO Office Action for U.S. Appl. No. 13/025,791 dated Nov. 25, 2011.
USPTO Office Action for U.S. Appl. No. 13/025,833 dated Dec. 14, 2011.
USPTO Office Action for U.S. Appl. No. 13/025,860 dated Dec. 30, 2011.
USPTO Notice of Allowance for U.S. Appl. No. 13/025,860 dated Jun. 8, 2012.
USPTO Office Action for U.S. Appl. No. 13/025,833 dated Jul. 12, 2012.
USPTO Notice of Allowance for U.S. Appl. No. 29/399,523 dated Mar. 5, 2012.
USPTO Notice of Allowance for U.S. Appl. No. 29/399,524 dated Mar. 2, 2012.
USPTO Office Action for U.S. Appl. No. 13/025,791 dated Feb. 20, 2013.
International Preliminary Report & Written Opinion of PCT Application No. PCT/US2011/060030 dated Mar. 21, 2012, 11 pgs. total.
'CFL Ballast IC Drive LED', www.placardshop.com, Blog, May 22, 2012, 3 pgs.
Rausch et al., 'Use a CFL ballast to drive LEDs', EDN Network, 2007, pp. 1-2.
USPTO Office Action for U.S. Appl. No. 12/785,953 dated Jan. 11, 2013.
USPTO Notice of Allowance for U.S. Appl. No. 13/025,791 dated Jun. 17, 2013.
USPTO Office Action for U.S. Appl. No. 13/025,833 dated Apr. 26, 2013.

* cited by examiner

ILLUMINATION SOURCE AND MANUFACTURING METHODS

CROSS-REFERENCE TO RELATED APPLICATION

The present application relates to pending patent application No. 61/301,193, filed Feb. 3, 2010, entitled "White Light Apparatus and Method," incorporated herein by reference for all purposes.

BACKGROUND OF THE INVENTION

This invention relates to high efficiency lighting sources.

The era of the Edison vacuum light bulb may soon end. In many countries, and in many states, incandescent bulbs are being replaced, and more efficient lighting sources mandated. Alternative light sources include fluorescent tubes, halogen, and light emitting diodes (LEDs). Despite the availability and improved efficiencies of these options, many people are reluctant to switch to these alternative light sources.

The newer technologies have not been widely embraced for various reasons. One such reason is the use of toxic substances in the lighting source. As an example, fluorescent lighting sources typically rely upon mercury in a vapor form to produce light. Because the mercury vapor is a hazardous material, spent lamps cannot simply be disposed of at the curbside, but must be transported to designated hazardous waste disposal sites. Additionally, some fluorescent tube manufacturers instruct the consumer to avoid using the bulb in sensitive areas of the house such as bedrooms.

Another reason for the slow adoption of alternative lighting sources is its low performance compared to the incandescent light bulb. Fluorescent lights rely upon a separate starter or ballast mechanism to initiate the illumination. Thus they sometimes do not turn on "instantaneously" as consumers expect. In addition fluorescent lights typically do not immediately provide light at full brightness, instead ramping up to full brightness over time. Further, most fluorescent lights are fragile, are not capable of dimming, have ballast transformers that can be noisy, and can fail if cycled on and off frequently.

Another type of alternative lighting source more recently introduced relies on the use of light emitting diodes (LEDs). LEDs have advantages over fluorescent lights including the robustness and reliability inherent in solid state devices, the lack of toxic chemicals that can be released during accidental breakage or disposal, instant-on capabilities, dimmability, and the lack of audible noise. LED lighting sources, however, have drawbacks that cause consumers to be reluctant to use them.

One disadvantage with LED lighting is that the light output (e.g. lumens) is relatively low. Although current LED lighting sources draw a significantly lower amount of power than their incandescent equivalents (e.g. 5-10 watts v. 50 watts), they can be too dim to be used as primary lighting sources. For example, a typical 5 watt LED lamp in the MR16 form factor may provide 200-300 lumens, whereas a typical 50 watt incandescent bulb in the same form factor may provide 700-1000 lumens. As a result, current LEDs are often used only for accent lighting or in areas where more illumination is not required.

Another drawback of LED lighting is the upfront cost of the LED. A current 30 watt equivalent LED bulb costs over $60, in comparison to an incandescent floodlight costing about $12. Although the consumer may "make up the difference" over the lifetime of the LED in reduced electricity costs, the higher initial cost suppresses demand.

Another concern with LED lighting is the amount of parts and the labor of production. An MR16 LED light source from one manufacturer requires 14 components, while another utilizes more than 60 components. Another disadvantage of LED lighting is that the output performance is limited by the need for a heat sink. In many applications, the LEDs are placed in an enclosure with poor air circulation, such as a recessed ceiling enclosure, where the temperature is usually over 50 degrees C. At such temperatures the emissivity of surfaces play only a small roll in dissipating heat. Further, because conventional electronic assembly techniques and LED reliability factors limit PCB board temperatures to about 85 degrees C., the power output of the LEDs is also constrained. Traditionally, light output from LED lighting sources have been increased by simply increasing the number of LEDs, which has lead to increased device costs, and increased device size. Additionally, such lights have had limited beam angles and limited outputs.

BRIEF SUMMARY OF THE INVENTION

This invention provides a high efficiency lighting sources with increased light output, without increasing device costs or size, yet enables coverage of many beam angles, with high reliability and long life. Embodiments of the invention include an MR16 form factor light source. A lighting module includes from 20 to 110 LEDs arrayed in series upon a thermally conductive substrate. The substrate is soldered to a flexible printed circuit substrate (FPC) having a pair of input power connectors. The silicon substrate is physically bonded to an MR16 form factor heat sink via thermal epoxy. A driving module includes a high-temperature operating driving circuit attached to a rigid printed circuit board or a flexible printed circuit substrate. The driving circuit and FPC are encased in a thermally conductive plug base that is compatible with an MR16 plug, forming the base assembly module. A potting compound facilitating heat transfer from the driving circuit to the thermally conductive plug case is typically used. The driving circuits are coupled to input power contacts (e.g. 12, 24, 120, 220 volt AC) and coupled to output power connectors (e.g. 40 VAC, 120 VAC, etc.) The base assembly module is inserted into and secured within an interior channel of the MR16 form factor heat sink. The input power connectors are coupled to the output power connectors. A lens is then secured to the heat sink.

The driving module transforms the input power from 12 AC volts to a higher DC voltage, e.g. 40 to 120 Volts. The driving module drives the lighting module with the higher voltage. The emitted light is conditioned with the lens to the desired type of lighting, e.g. spot, flood, etc. In operation, the driving module and the lighting module produce heat that is dissipated by the MR16 form factor heat sink. At steady state, these modules may operate in the range of approximately 75° C. to 130° C.

The MR16 form factor heat sink facilitates the dissipation of heat. The heat sink includes an inner core that has a diameter less than half the outer diameter of the heat sink, and can be less than one third to one fifth the outer diameter. The silicon substrate of the LEDs is directly bonded to the inner core region with thermal epoxy.

Because the diameter of the inner core is less than the outer diameter, more heat dissipating fins can be provided. Typical fin configurations include radiating fin "trunks" extending from the inner core. In some embodiments, the number of trunks range from 8 to 35. At the end of each trunk, two or more fin "branches" are provided having a "U" branching shape. At the end of each branch, two or more fin "sub-branches" are provided, also having a "U" branching shape. The fin thickness of the trunk is usually thicker than the branches, which in turn are thicker than the sub-branches, etc. The heat flow from the inner core towards the outer diameter, airflow, and surface area depends on the precise structure.

A method for implementing the structure includes steps of: providing an LED package assembly with LEDs on a silicon substrate electrically coupled to a flexible printed circuit. The LED package assembly is bonded with a thermally conductive adhesive to a heat-sink having heat dissipating fins. An LED driver module having a driver circuit is affixed to a flexible printed circuit board within a thermally conductive base. A lens focuses the light as desired.

In one embodiment a light chip assembly has LEDs formed upon a silicon substrate and a flexible printed circuit coupled to the silicon substrate. A heat-sink is coupled to the light chip assembly, with the silicon substrate coupled to an inner core region via a thermally conductive adhesive. The outer core includes branching heat-dissipating fins. The LED driver module includes a housing and an LED driver circuit. A second flexible printed circuit is coupled to the LED driver circuit, with a lens coupled to the inner core region of the heat-sink. An epoxy layer between the planar substrate and the planar region conducts heat from the LED assembly to the inner core region.

According to another aspect of the invention, a method for forming a light source includes disposing LEDs on an insulated substrate which has input pads to receive power for the LEDs, bonding a flexible printed circuit to the substrate which also has input contacts to receive the operating voltage and output pads to provide the operating voltage to the insulated substrate. The insulated substrate is bonded onto a planar region of a heat sink using a thermally conductive adhesive. A driving module has electronic circuits and receives a driving voltage from an external voltage source and is in a casing having a base with contacts protruding beyond the casing. The casing is positioned in an interior channel of the heat sink.

In another aspect of the invention, an illumination source includes an MR-16 compatible heat sink coupled to an LED assembly. The MR-16 compatible heat sink has an inner core region and an outer core region, with the LED assembly disposed in the inner core region. The simplified construction facilitates volume manufacturing, elimination of hand wiring

DETAILED DESCRIPTION OF THE INVENTION

Figure 1A:
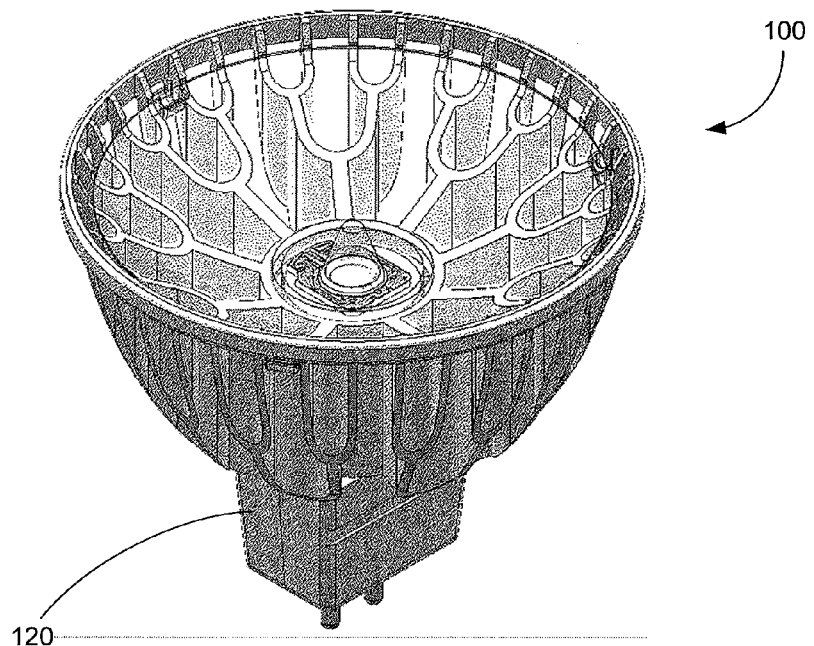
FIGS. 1A and 1B are perspective views of two MR-16 form factor implementations of the invention.
Figure 1B:
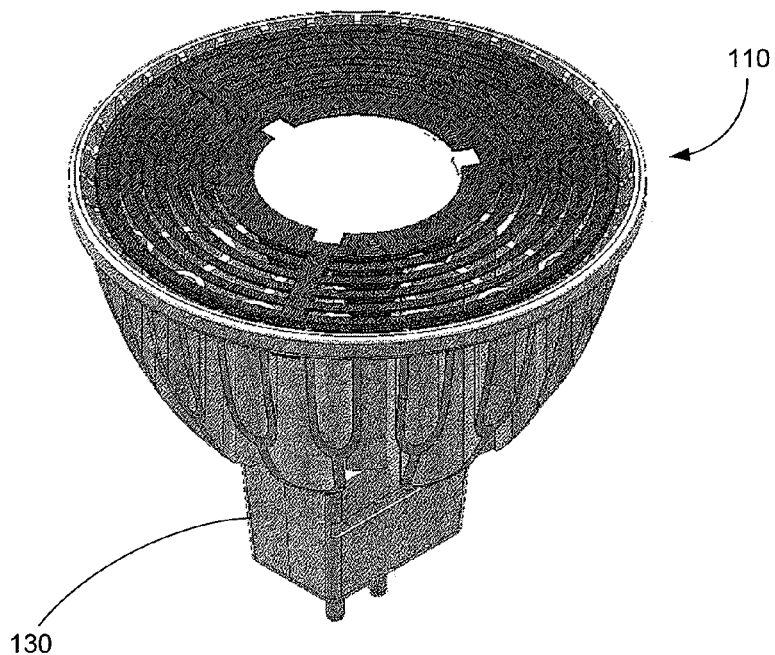

FIGS. 1A-B illustrate two embodiments of the present invention. More specifically, FIGS. 1A-B illustrate embodiments of MR-16 form factor compatible LED lighting sources 100 and 110 having GU 5.3 form factor compatible bases 120 and 130. MR-16 lighting sources typically operate with 12 volt alternating current (VAC). In the figures LED lighting source 100 is provides a spot light having a 10 degree beam, while LED lighting source 110 provides a flood light having a 25 to 40 degree beam.

An LED assembly such as described in the pending patent application described above may be used within LED lighting sources 100 and 110. LED lighting source 100 provides a peak output brightness from approximately 7600 to 8600 candelas (with approximately 360 to 400 lumens), with peak output brightness of approximately 1050 to 1400 candelas for a 40 degree flood light (approximately 510 to 650 lumens), and approximately 2300 to 2500 candelas for a 25 degree flood light (approximately 620 to 670 lumens). Therefore the output brightness is about the same brightness as a conventional halogen bulb MR-16 light.

Figure 2A:
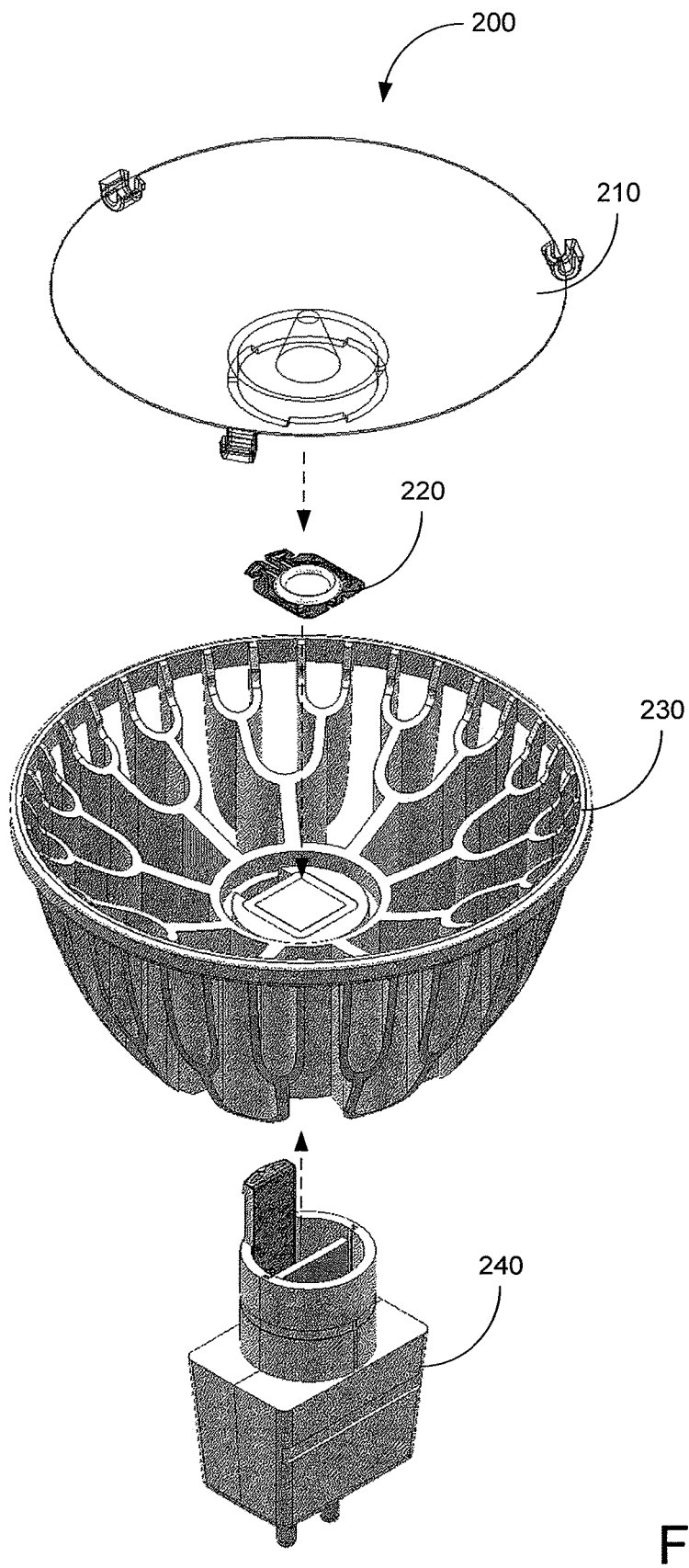
FIGS. 2A and 2B are exploded views of the apparatus of FIGS. 1A and 1B.
Figure 2B:
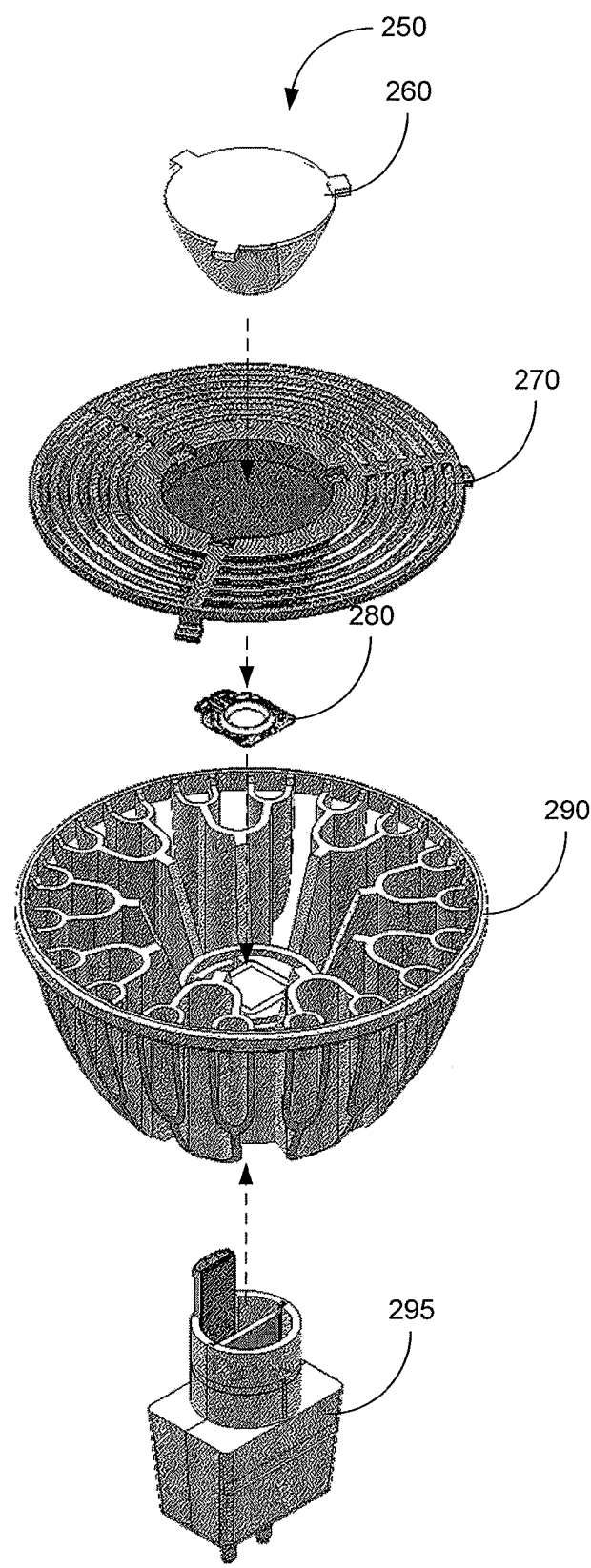

FIGS. 2A and 2B are diagrams illustrating exploded views of FIGS. 1A and 1B. FIG. 2A illustrates a modular diagram of a spot light 200, and FIG. 2B illustrates a modular diagram of a flood light 250. Spotlight 200 includes a lens 210, an LED assembly module 220, a heat sink 230, and a base assembly module 240. Flood light 250 includes a lens 260, a lens holder 270, an LED assembly module 280, a heat sink 290, and a base assembly module 295. The modular approach to assembling spotlight 200 or floodlight 250 reduces manufacturing complexity and cost, and increases the reliability of such lights.

Lens 210 and lens 260 may be formed from a UV resistant transparent material, such as glass, polycarbonate material, or the like. Lens 210 and 260 may be used to creates a folded light path such that light from the LED assembly 220 reflects internally more than once before being output. Such a folded optic lens enables spotlight 200 to have a tighter columniation of light than is normally available from a conventional reflector of equivalent depth.

To increase durability of the lights, the transparent material is operable at an elevated temperature (e.g. 120 degrees C.) for a prolonged period of time, e.g. hours. One material that may be used for lens 210 and lens 260 is Makrolon™ LED 2045 or LED 2245 polycarbonate available from Bayer Material Science AG. In other embodiments, other similar materials may also be used.

In FIG. 2A, lens 210 is secured to heat sink 230 via clips on the edge of lens 210. Lens 210 may also be secured via an adhesive proximate to where LED assembly 220 is secured to heat sink 230. In FIG. 2B, lens 260 is secured to a lens holder 270 via tabs on the edge of lens 260. In turn, lens holder 270 may be secured to heat sink 290 by more tabs on the edge of lens holder 270, as illustrated. Lens holder 270 is preferably white plastic material to reflect scattered light through the lens. Other similar heat resistant material may also be used for lens holder 270.

LED assembly 220 and LED assembly 280 may be of similar construction, and thus interchangeable during the manufacturing process. In other embodiments, LED assemblies may be selected based upon lumen per watt efficacy. For example, in some examples, a LED assembly having a lumen per watt (L/W) efficacy from 53 to 66 L/W is used for 40 degree flood lights, a LED assembly having an efficacy of approximately 60 L/W is used for spot lights, a LED assembly having an efficacy of approximately 63 to 67 L/W is used for 25 degree flood lights, etc.

LED assembly 220 and LED assembly 280 typically include 36 LEDs arranged in series, in parallel-series, e.g. three parallel strings of 12 LEDs in series, or in other configurations. Further detail regarding such LED assemblies is provided in the patent application incorporated by reference above.

In one embodiment, the targeted power consumption for the LED assemblies is less than 13 watts. This is much less than the typical power consumption of halogen based MR16 lights (50 watts). As a result, embodiments of the invention match the brightness or intensity of halogen based MR16 lights, but use less than 20% of the energy.

LED assembly 220 and 280 are secured to heat sinks 230 and 290. LED assemblies 220 and 280 typically include a flat substrate such as silicon. (The operating temperature of LED assemblies 220 and 280 is on the order of 125 to 140 degrees C.) The silicon substrate can be secured to the heat sink using a high thermal conductivity epoxy, e.g. thermal conductivity ~96 W/m.k. Alternatively, a thermoplastic—thermoset epoxy may be used such as TS-369 or TS-3332-LD, available from Tanaka Kikinzoku Kogyo K.K. Of course other epoxies, or other fastening means may also be used.

Heat sinks 230 and 290 are preferably formed from a material having a low thermal resistance and high thermal conductivity. In some embodiments, heat sinks 230 and 290 are formed from an anodized 6061-T6 aluminum alloy having a thermal conductivity k=167 W/m.k., and a thermal emissivity e=0.7. In other embodiments, materials such as 6063-T6 or 1050 aluminum alloy having a thermal conductivity k=225 W/mk and a thermal emissivity e=0.9, or alloys such AL 1100, are used. Additional coatings may also be added to increase thermal emissivity, for example, paint from ZYP Coatings, Inc. utilizing CR2O3 or CeO2 provides thermal emissivity e=0.9; or Duracon™ coating provided by Materials Technologies Corporation has a thermal emissivity e>0.98.

At an ambient temperature of 50 degrees C., and in free natural convection, heat sink 230 was measured to have a thermal resistance of approximately 8.5 degrees C./Watt, and heat sink 290 was measured to have a thermal resistance of approximately 7.5 degrees C./Watt. With further development and testing, it is believed that a thermal resistance of as little as 6.6 degrees C./Watt are achievable in other embodiments.

Base assemblies or modules 240 and 295 in FIGS. 2A-B provide a standard GU 5.3 physical and electronic interface to a light socket. Base modules 240 and 295 include high temperature resistant electronic circuitry used to drive LED modules 220 and 280. An input voltage of 12 VAC to the LEDs is converted to 120 VAC, 40 VAC, or other desired voltage by the LED driving circuitry.

The shell of base assemblies 240 and 295 is typically aluminum alloy, formed from an alloy similar to that used for heat sink 230 and heat sink 290, for example, AL 1100 alloy. To facilitate heat transfer from the LED driving circuitry to the shells of the base assemblies, a compliant potting compound such as Omegabond® 200, available from Omega Engineering, Inc., or 50-1225 from Epoxies, Etc., may be used.

Figure 3A:
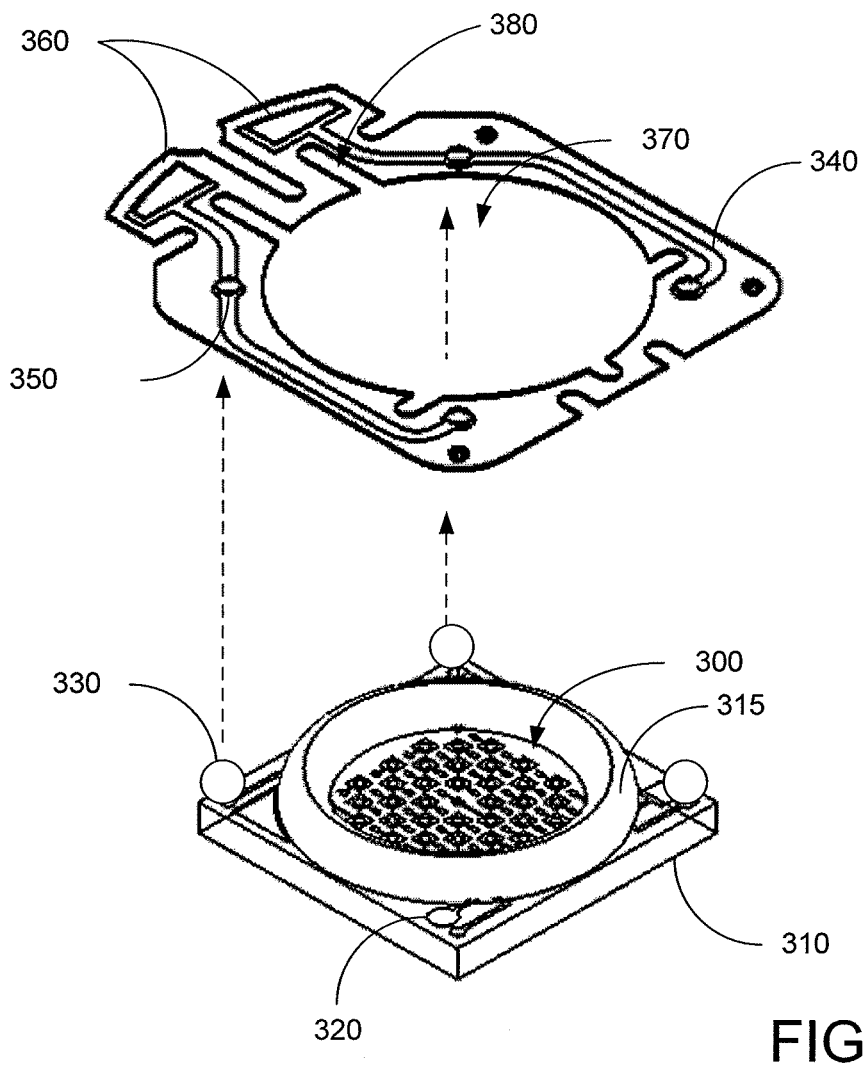
FIGS. 3A and 3B illustrate LED assemblies for use with the apparatus of FIGS. 1 and 2.
Figure 3B:
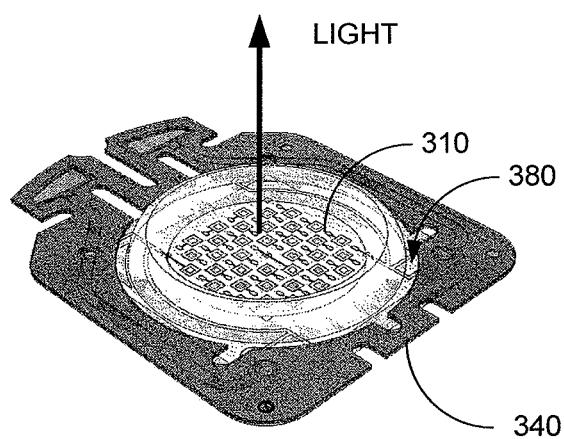

FIGS. 3A and 3B illustrate an LED assembly for use with the lights described above. FIG. 3A illustrates an LED package subassembly, also referred to as an LED module. A plurality of LEDs 300 are affixed to a substrate 310. The LEDs 300 are connected in series and powered by a voltage source of approximately 120 volts AC. To enable a sufficient voltage drop (e.g. 3 to 4 volts) across each LED 300, 30 to 40 LEDs are used, e.g. 37 to 39 LEDs coupled in series. In other embodiments, LEDs 300 are connected in parallel series and powered by a voltage source of approximately 40 VAC. IN that implementation, LEDs 300 include 36 LEDs arranged in three groups each having 12 LEDs 300 coupled in series. Each group is thus coupled in parallel to the voltage source (40 VAC) provided by the LED driver circuitry, such that a sufficient voltage drop (e.g. 3 to 4 volts) is provided across each LED 300. In other embodiments, other driving voltages and other arrangements of LEDs 300 can be used.

LEDs 300 are mounted upon a silicon substrate 310 or other thermally conductive substrate, usually with a thin electrically insulating layer and/or a reflective layer separating them from the substrate 310. Heat from LEDs 300 is transferred to silicon substrate 310 and to a heat sink via a thermally conductive epoxy, as discussed above.

In one embodiment, silicon substrate is approximately 5.7 mm×5.7 mm, and approximately 0.6 microns thick. The dimensions may vary according to specific lighting requirement. For example, for lower brightness intensity, fewer LEDs are mounted upon a smaller substrate.

As shown in FIG. 3A, a ring of silicone 315 is disposed around LEDs 300 to define a well-type structure. In various embodiments, a phosphorus bearing material is disposed within the well structure. In operation, LEDs 300 provide a blue-ish light, violet light, or ultraviolet light. In turn, the phosphorous bearing material is excited by the light from the LEDs and emits white light.

As illustrated in FIG. 3A, bonding pads 320 are provided upon substrate 310 (e.g. 2 to 4). Then, a conventional solder layer (e.g. 96.5% tin and 5.5% gold) may be used to provide solder balls 330 thereon. In the embodiments illustrated in FIG. 3A, four bonding pads 320 are provided, one at each corner, two for each power supply connection. In other embodiments, only two bond pads may be used, one for each AC power supply connection.

Also illustrated in FIG. 3A is a flexible printed circuit (FPC) 340. FPC 340 includes a flexible substrate material, such as a polyimide, Kapton™ from DuPont, or the like. As illustrated, FPC 340 has bonding pads 350 for electrical connections to substrate 310, and bonding pads 360 for connection to the supply voltage. An opening 370 provides for light from the LEDs 300.

Various shapes and sizes for FPC 340 may be used. For example, as illustrated in FIG. 3A, a series of cuts 380 reduce the effects of expansion and contraction of FPC 340 compared to substrate 310. FPC 340 may be crescent shaped, and opening 370 may not be a through hole. In other embodiments, other shapes and sizes for FPC 340 can be used depending on the application.

In FIG. 3B, substrate 310 is bonded to FPC 340 via solder balls 330, in a conventional flip-chip type arrangement to the top surface of the silicon. By making the electrical connection at the top surface of the silicon, the entire bottom surface of the silicon can be used to transfer heat to the heat sink. Additionally, this allows the LED to bonded directly to the heat sink to maximize heat transfer instead of a PCB material that typically inhibits heat transfer. Subsequently, a under fill operation is performed, e.g. with silicone, to seal the space 380 between substrate 310 and FPC 340. FIG. 3B shows the LED sub assembly or module as assembled.

Figure 4A:
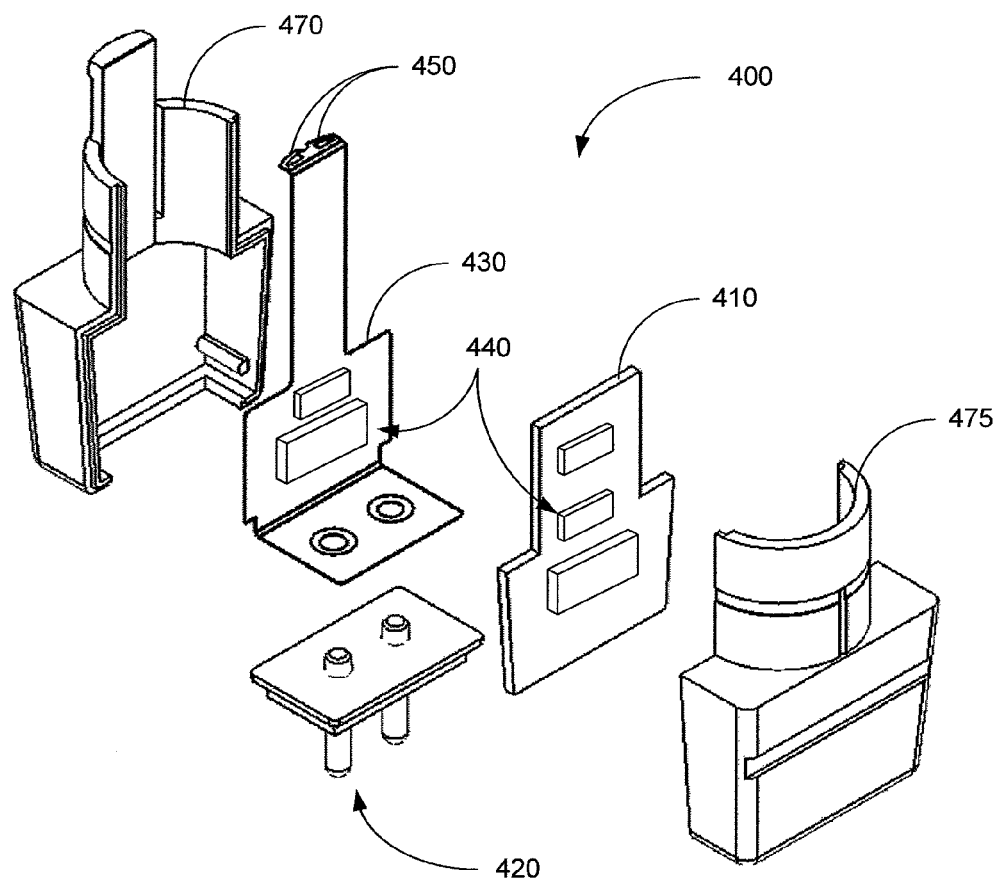
FIGS. 4A and 4C illustrate a driver module and LED driver circuit.
Figure 4B:
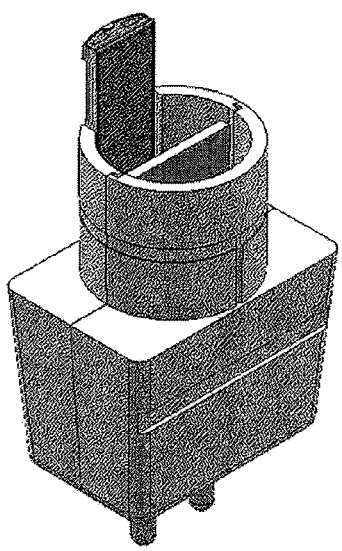

FIGS. 4A and 4B illustrate a driver module or LED driver circuit 400 for driving the LED module described above in FIGS. 3A and 3B. Driver circuit 400 includes contacts 420, and a flexible printed circuit 430 electrically coupled to circuit board 410. Contacts 420 are conventional GU 5.3 compatible electrical contacts to couple driver circuit 400 to the operating voltage. In other embodiments, other base form factors for the electrical contacts are used.

Figure 4C:
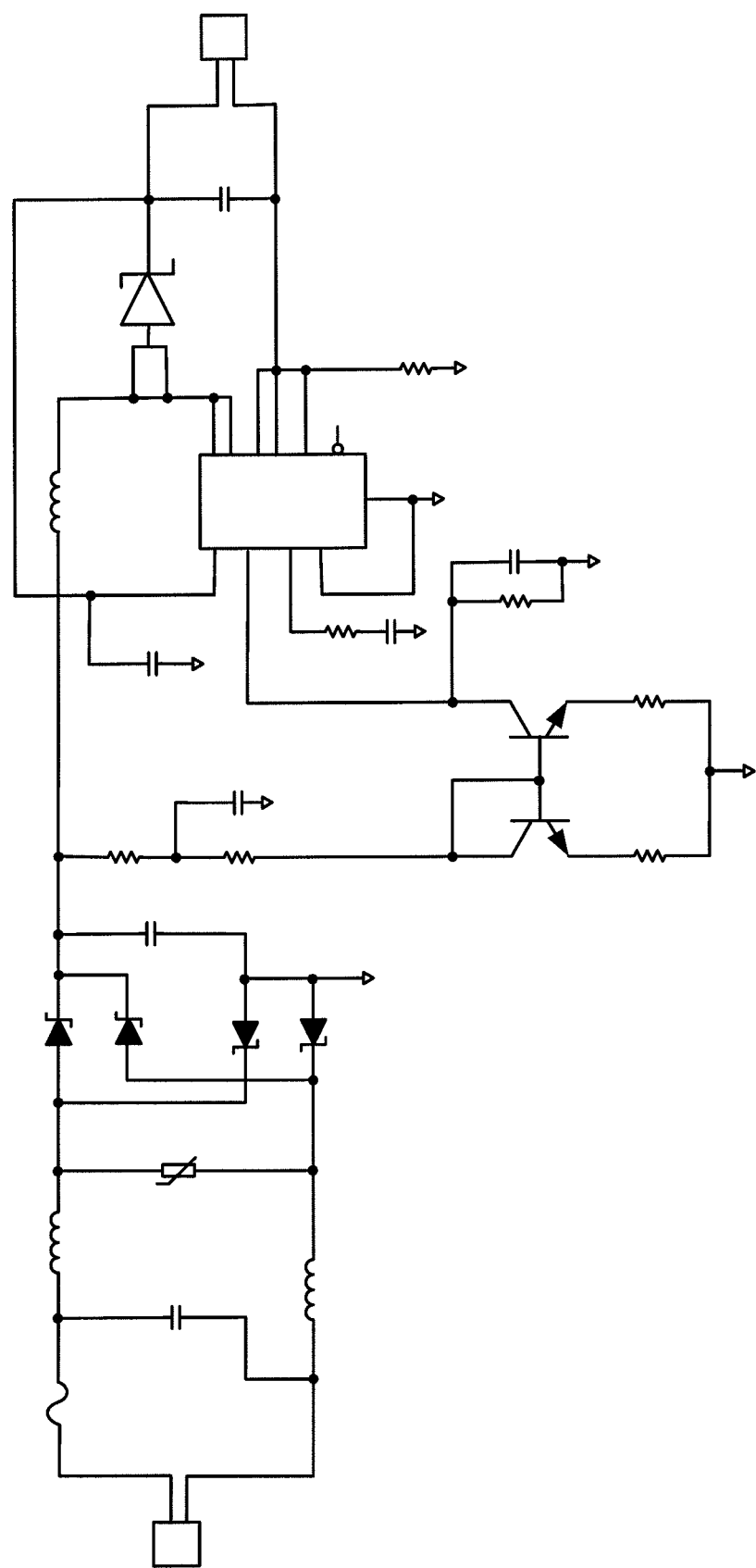

Electrical components 440 may be provided on circuit board 410 and on FPC 430. The electrical components 440 include circuitry that receives the operating voltage and converts it to an LED driving voltage. FIG. 4C is a circuit diagram providing this step-up voltage functionality. A typical driving circuit is a Max 16814 LED driving circuit available from Maxim Integrated Products, Inc. In FIG. 4A, the output LED driving voltage is provided at contacts 450 of FPC 430. These contacts 450 are coupled to bonding pads 360 of the LED module illustrated in FIGS. 3A-B, above.

FIG. 4A also illustrates a base casing. The base casing includes two separate portions 470 and 475 molded from an aluminum alloy. As shown in FIGS. 2A and 2B, the base casing is preferably mated to an MR-16 format compatible heat sink.

The LED driver circuit 400 is disposed between portions 470 and 475, and contacts 420 and contacts 450 remain outside. Portions 470 and 475 are then affixed to each other, e.g. welded, glued or otherwise secured. Portions 470 and 475 include molded protrusions that extend towards LED circuitry 440. The protrusions may be a series of pins, fins, or the like, and provide a way for heat to be conducted away from LED driver circuit 400 towards the base casing.

Lamps as depicted operate at high operating temperatures, e.g. as high as 120° C., The heat is produced by electrical components 440, as well as heat generated by the LED module. The LED module transfers heat to the base casing via the heat sink. To reduce the heat load upon electrical components 440, a potting compound, such as a thermally conductive silicone rubber (Epoxies.com 50-1225, Omegabond® available from Omega Engineering, Inc., or the like) may be injected into the interior of the base casing in physical contact with LED driver circuits 400 and the base casing, to help conduct heat from LED driver circuitry 400 outwards to the base casing.

Figure 5A:
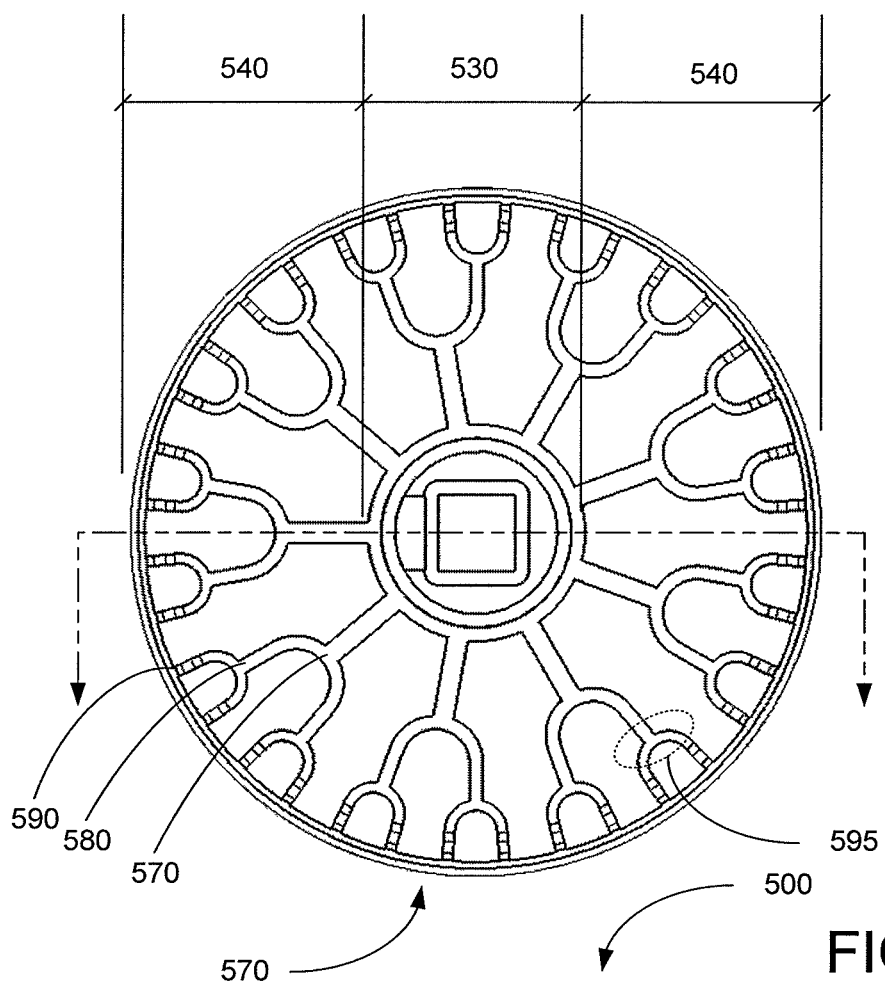
FIGS. 5A and 5B illustrate a heat sink for an MR-16 compatible light.
Figure 5B:
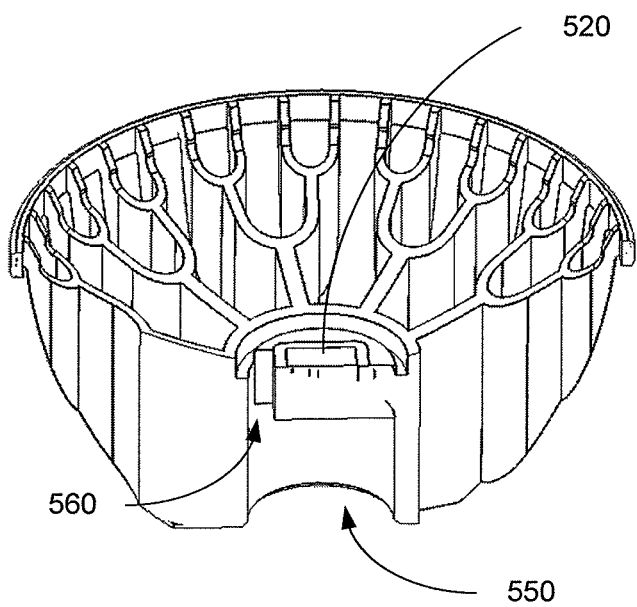

FIGS. 5A and 5B illustrate embodiment of a heat sink 500 for an MR-16 compatible spot light. Heat sink 500 and 510 are typically aluminum alloy with low thermal resistance, e.g., black anodized 6061-T6 aluminum alloy having a thermal conductivity k=167 W/mk, and a thermal emissivity e=0.7. Other materials also may be used such as 6063-T6 or 1050 aluminum alloy having a thermal conductivity k=225 W/mk and a thermal emissivity e=0.9. In other embodiments, still other alloys such AL 1100, may be used. Coatings may be added to increase thermal emissivity, for example, paint provided by ZYP Coatings, Inc. utilizing CR2O3 or CeO2 provides a thermal emissivity e=0.9 while Duracon™ coatings provided by Materials Technologies Corporation provides a thermal emissivity e>0.98; and the like.

In FIG. 5A, a relatively flat section 520 defines an inner core region 530 and an outer core region 540. An LED module as described above is bonded to flat section 520 of inner core 530, while outer core 540 helps dissipate the heat from the light and base modules. Inner core region 530 can be dramatically smaller than light generating regions of currently available MR-16 lights based on LEDs. As illustrated in FIG. 5A, the diameter of inner core region 530 is less than one-third the diameter of outer core region 540, and typically about 30% of the diameter. Fins 570 dissipate heat, reducing the operating temperature of the LED driver circuitry.

In FIG. 5A, the top view of heat sink 500 illustrates a configuration of fins according to one embodiment of the invention. A series of nine branching fins 570 is illustrated. Each heat fin 570 includes a trunk region and branches 580. The branches 580 include sub-branches 590, and more sub-branches can be added if desired. Also, the ratios of the lengths of the trunk region, branches 580 and sub-branches 590 may be modified from the ratios illustrated. The thickness of the heat fins decreases toward the outer edge of the heat sink, for example, the trunk region is thicker than branches 580, that are, in turn, thicker than sub-branches 590.

Additionally, as can be seen in FIGS. 5A and 5B, when heat fins 570 branch, they branch off in a two to one ratio and in a "U" shape 595. In various embodiments, the number of branches 580 extending from the trunk region, and the number of sub-branches 590 extending from and branches 580 may be modified from the number (two branches) illustrated. The heat dissipation performance of heat sinks using the principles discussed can be optimized for various conditions. For example, different numbers of branching heat fins 570 (e.g. 7, 8, 9, 10); different ratios of lengths of the trunks to branches, branches to sub-branches, different thicknesses for the trunks, branches, sub-branches; different branch shapes; and different branching patterns can be used.

In FIG. 5B, a cross-section of heat sink 500 is illustrated including an interior channel 550. Interior channel 550 is adapted to receive the base module including the LED driver electronics, as described above. A narrower section 560 of interior channel 550 is also illustrated. The thinner neck portion of the LED driver module, including LED driving voltage contacts, (e.g. bonding pads) shown in FIG. 4A, are inserted through narrower section 560, and locked into place by tabs on the LED driver module.

Figure 6A:
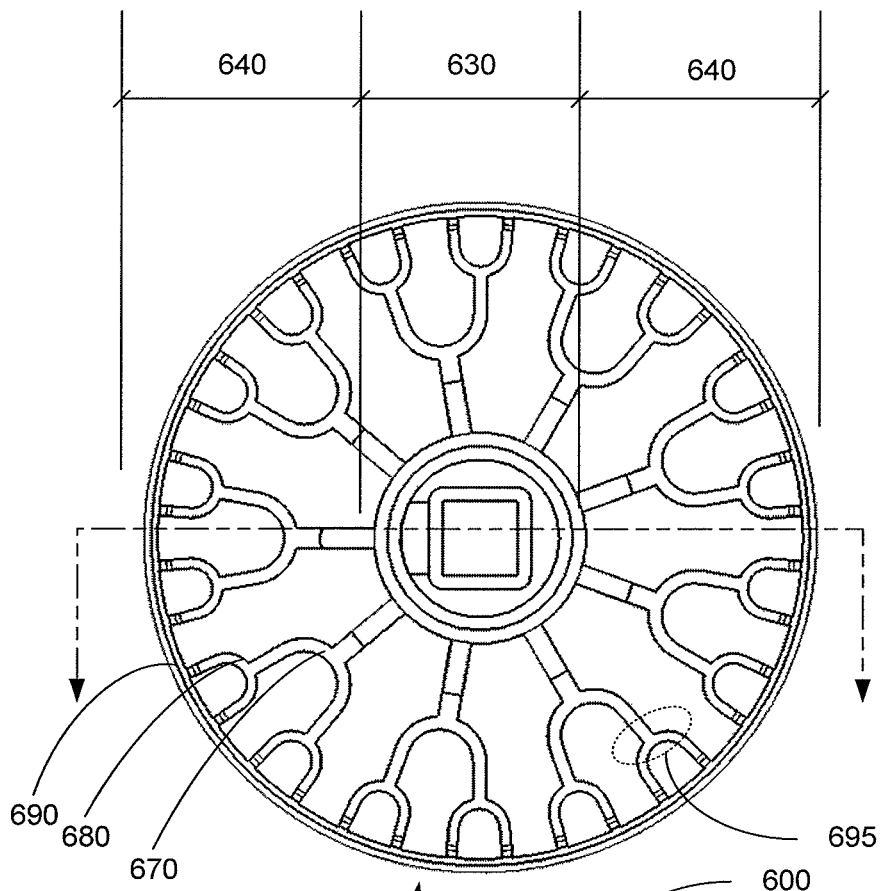
FIGS. 6A and 6B illustrate a heat sink for another MR-16 compatible light.
Figure 6B:
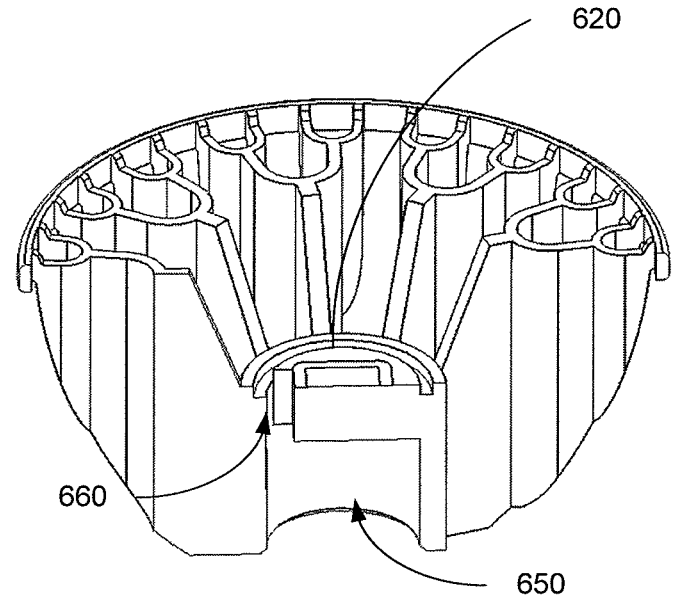

FIGS. 6A and 6B illustrate another embodiment of the invention. More specifically, FIGS. 6A and 6B illustrate an embodiment of a heat sink 600 for an MR-16 compatible flood light. The discussion above with respect to FIGS. 5A and 5B is applicable to the flood light embodiment illustrated in FIGS. 6A and 6B. For example, a heat sink 600 typically has a flat region 620 where a LED light module is bonded via a thermally conductive adhesive. Because the performance of LED light module is higher, the LED light module is smaller, yet still provides the desired brightness. The inner core region 630 thus may be smaller in diameter and the outer core region 640 also smaller than other MR-16 LED lights. As discussed with regard to FIGS. 5A and 5B, any number of heat dissipating fins 670 may be provided in heat sink 600. Heat dissipating fins 670 have branches 680 and sub-branches 690, all with desired geometry a discussed with regard to FIGS. 5A-5B.

Figure 7A:
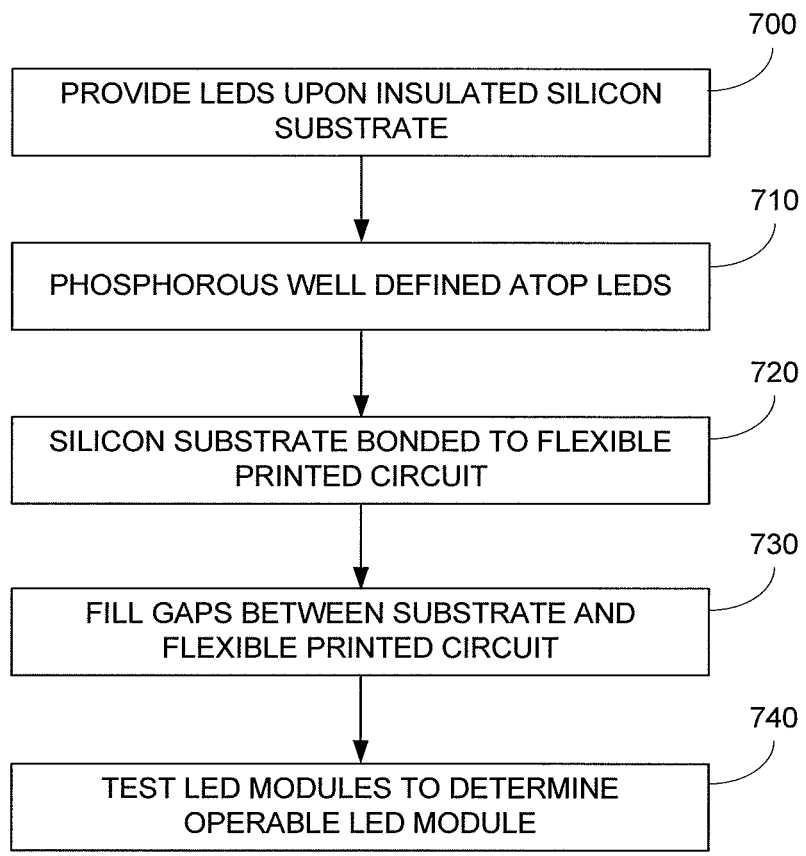
FIGS. 7A to 7C are a block diagram of a manufacturing process.
Figure 7B:
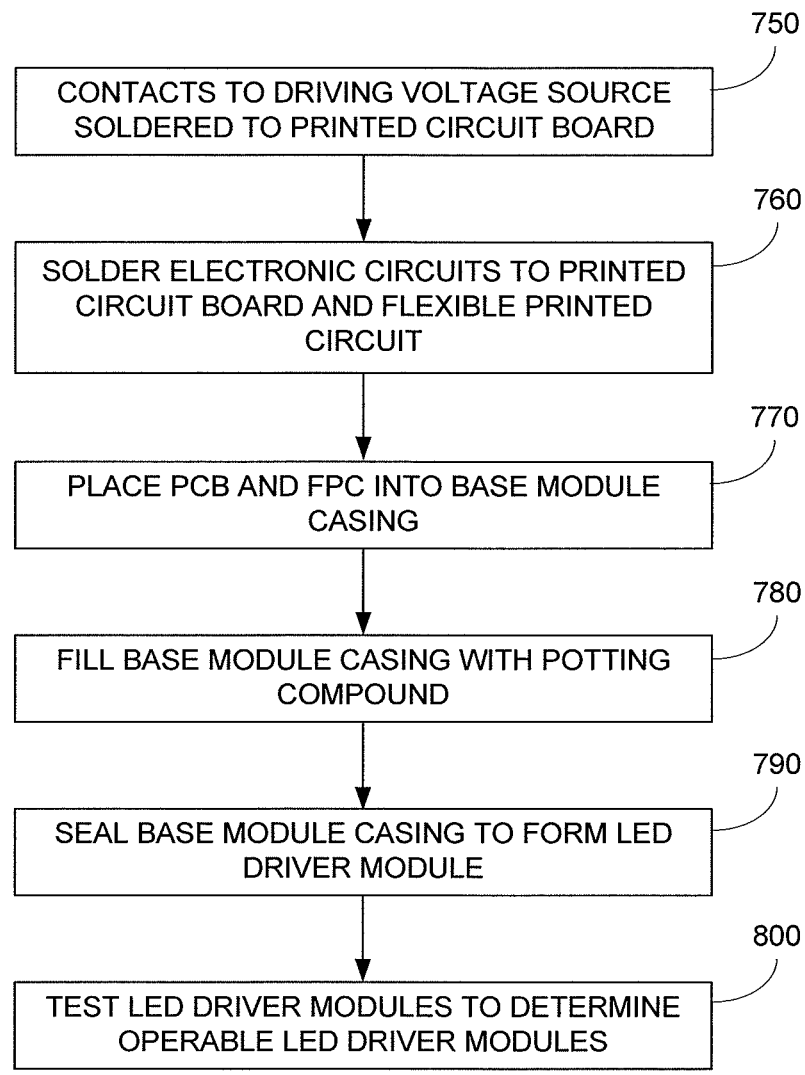
Figure 7C:
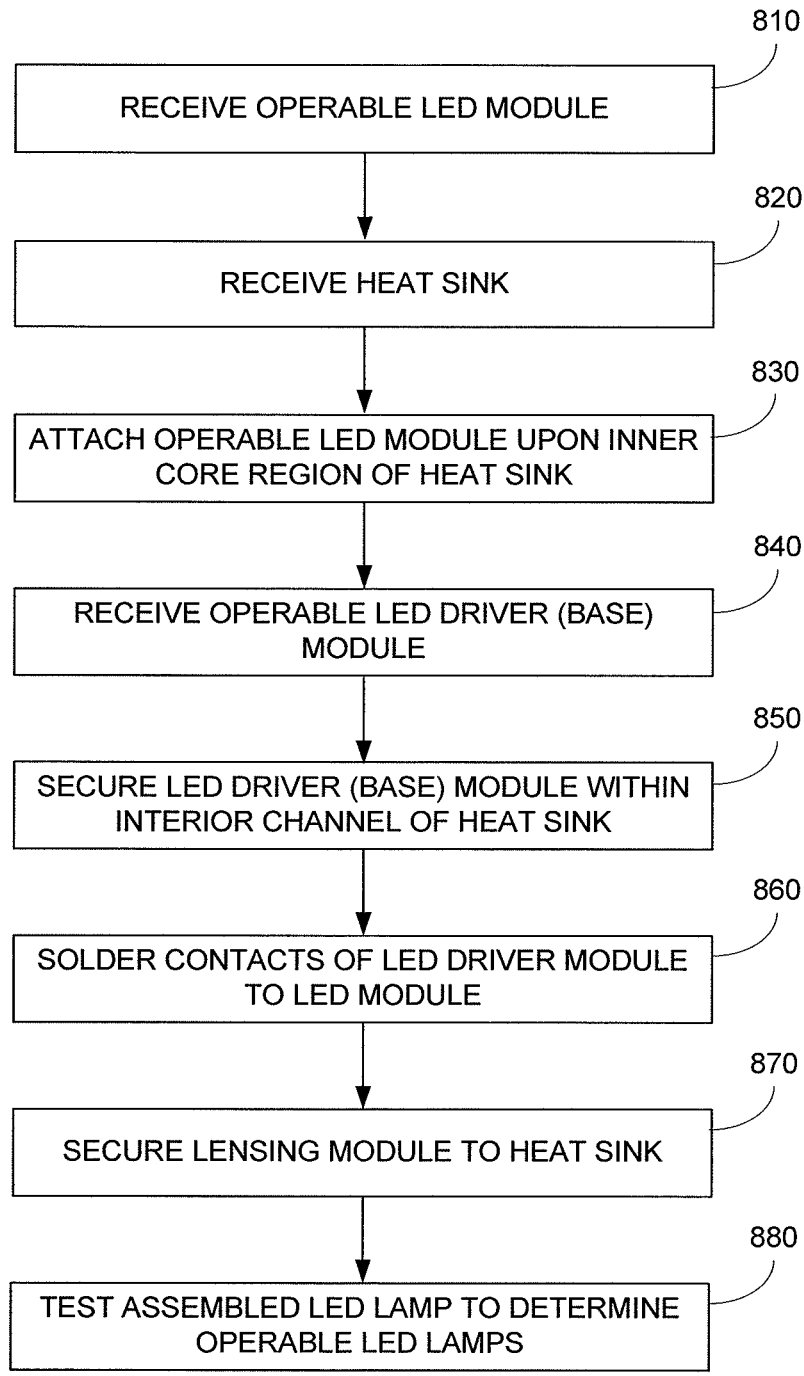

FIGS. 7A to 7C illustrate a block diagram of a manufacturing process. The process shown provides an LED light. Initially, LEDs 300 are provided upon an electrically insulated silicon substrate 310 and wired (step 700). As illustrated in FIG. 3A, a silicone dam 315 is placed on the silicon substrate 310 to define a well, which is then filled with a phosphor-bearing material (step 710). Next, the silicon substrate 310 is bonded to a flexible printed circuit 340 (step 720). As disclosed above, a solder ball and flip-chip soldering (e.g. 330) may be used for the soldering process in various embodiments. Subsequently an under fill process may be performed to fill in gap 380, to form an LED assembly 340 (step 730). The LED assembly module may then be tested for proper operation (step 740).

Initially, a plurality of contacts 420 may be soldered or coupled to a printed circuit board 410 (step 750). These contacts 420 are for receiving a driving voltage of approximately 12 VAC. Next, a plurality of electronic circuit devices 440 (e.g. an LED driving integrated circuit) are soldered onto flexible printed circuit 430 and circuit board 410 (step 760). As discussed above, unlike present MR-16 light bulbs, the electronic circuit devices 440 are capable of sustained high-temperature operation. Subsequently the flexible printed circuit 430 and printed circuit board 410 are placed within two portions 470 and 475 of a base casing (step 770). As illustrated in FIGS. 4A-B, contacts 450 of flexible printed circuit 430 are exposed. Before sealing portions 470 and 475, a potting compound is injected within the base casing (step 780). Subsequently portions 470 and 475 are sealed, to form an LED module (step 790). The LED driving assembly module may then be tested for proper operation (step 800).

In FIG. 7C, a LED lamp assembly process is illustrated. Initially, a tested LED module is provided (step 810), together with a heat sink (500, 600) (step 820). The LED module is then attached to the heat sink (step 830).

A tested LED driver base module 295 is provided (step 840). Next, this module is inserted into an interior cavity (550, 560) of the heat sink (500, 600) (step 850). The LED driver module may be secured to the heat sink using tabs or lips on the LED driver module or the heat sink. Additionally, an adhesive may be used to secure the heat sink and the LED driver module.

The above operations places contacts 450 of LED driver (Base) module adjacent to contacts 360. Subsequently, a soldering step connects contacts 450 to contacts 360 (step 860). A hot bar soldering apparatus can be used to solder contacts 450 to contacts 360. As illustrated in FIG. 7C, lens modules then are secured to the heat sink (step 870). Subsequently, the assembled LED lamp are tested to determine proper operation (step 880). As described, embodiments of the invention provide a simplified method for manufacturing an MR16 LED lamp.

Figure 7D:
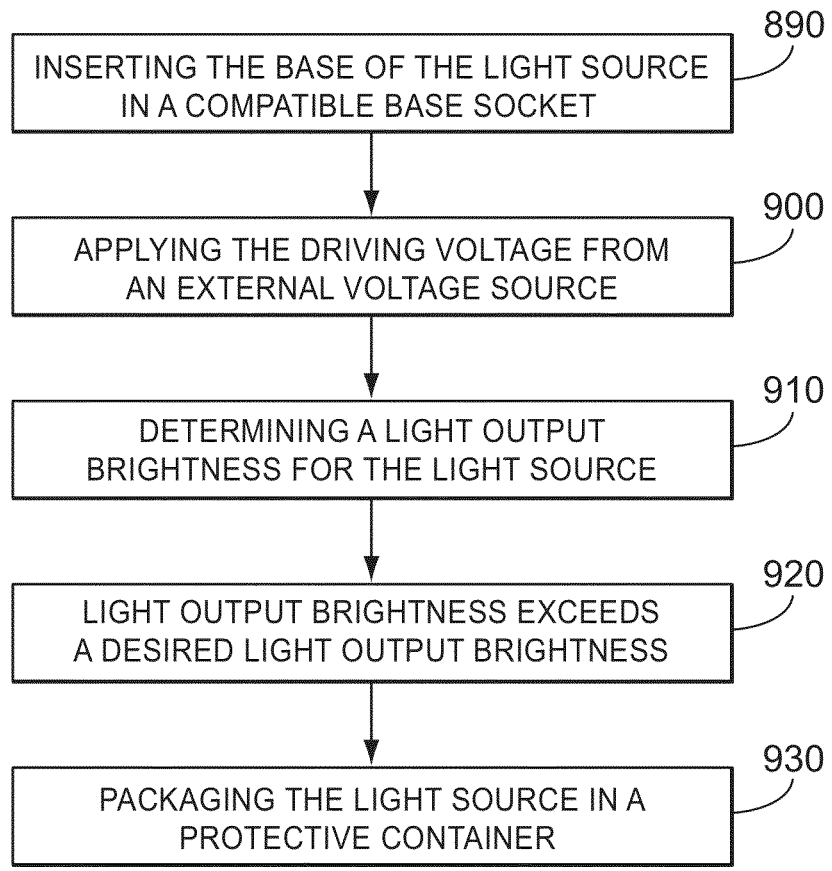
FIG. 7D is a simplified flow chart illustrating a process for testing a light source.

FIG. 7D is a simplified flow chart illustrating a process for testing a light source. Inserting the base of the light source in a compatible base socket (890) and applying a driving voltage from an external voltage source (900). Determining a light output brightness for the light source (910). When the light output brightness exceeds a desired light output brightness (920), then packaging the light source in a protective container (930).

The specification and drawings are illustrative of the design and process. Various modifications and changes may be made thereunto without departing from the broader spirit and scope of the invention as set forth in the claims below.

What is claimed is:

1. A method for forming a light source comprising:
    disposing light emitting diodes (LEDs) on an insulated substrate having input pads for receiving an operating voltage for the LEDs;
    bonding a flexible printed circuit to the insulated substrate, the flexible printed circuit including input contacts to receive the operating voltage and output pads to provide the operating voltage to the insulated substrate;
    bonding the insulated substrate onto a planar region of a heat sink using a thermally conductive adhesive;
    forming a driving module having a plurality of electronic circuits on a printed circuit board, the driving module including input contacts configured to receive a driving voltage from an external voltage source and a plurality of output contacts configured to output the operating voltage;
    disposing the driving module within a casing having a base, the plurality of input contacts and the plurality of output contacts extending beyond an interior of the casing;
    inserting the casing within an interior channel of the heat sink;
    electrically bonding the plurality of output contacts of the driving module to the plurality of input contacts of the flexible printed circuit;
    inserting the base in a compatible base socket;
    applying the driving voltage from the external voltage source;
    determining a light output brightness for the light source, and when the light output brightness exceeds a desired light output brightness; and
    packaging the light source in a protective container.

2. The method of claim 1 further comprising securing a lens to the heat-sink, the heat sink having an MR16 form factor and the base being GU5.3 compatible.

3. The method of claim 1 wherein the LEDs comprise at least 30 LEDs.

4. The method of claim 1 wherein the output voltage from the driving module is at least 40 VAC.

5. The method of claim 1 wherein the step of disposing the driving module within the casing further comprises disposing a thermally conductive compound within the casing between the driving module and the casing.

6. The method of claim 1 wherein the driving module includes a flexible printed circuit having output contacts and the output contacts on the flexible printed circuit board are connected to the input contacts.

7. The method of claim 1
    wherein the planar region of the heat sink has a first diameter;
    wherein the heat sink comprises a rim having a maximum diameter; and
    wherein the first diameter is less than approximately one-third of the maximum diameter.

8. The method of claim 1 wherein the heat sink includes a plurality of branching heat fins coupled between the planar region and the rim.

9. The method of claim 1 wherein the plurality of LEDs comprise at least two strings of LEDs coupled in parallel, and LEDs within a string being coupled in series.

10. A light source comprising:
    light emitting diodes (LEDs) disposed upon an insulated substrate having input pads coupled to receive an operating voltage for the LEDs;
    a flexible printed circuit bonded to the insulated substrate, the flexible printed circuit including a plurality of input contacts configured to receive the operating voltage for the LEDs and a plurality of output pads to provide the operating voltage to the insulated substrate;
    an heat sink including a planar region having the insulated substrate affixed thereto with a thermally conductive epoxy;
    a driving module having electronic circuits disposed on a printed circuit board, input contacts configured to receive the a driving voltage from an external voltage source, and a output contacts configured to output the operating voltage;
    a casing having a base, wherein the driving module is disposed within the casing, the input contacts and the output contacts extending beyond an interior of the casing; wherein the casing is disposed within an interior channel of the heat sink; and wherein the output contacts of the driving module are bonded to the input contacts to provide the light source;
    a base socket, wherein the base is disposed in the base socket;
    an external voltage source configured to provide a driving voltage; and
    a protective container, wherein the light source exceeds a desired light output brightness.

11. The light source of claim 10 further comprising a lens coupled to the heat-sink.

12. The light source of claim 10 wherein at least 30 LEDs are disposed on the substrate.

13. The light source of claim 10 further comprising a potting compound disposed within the casing.

14. The light source of claim 10 wherein the LEDs have an output brightness greater than approximately 7500 candela.

15. The light source of claim 10 wherein the LEDs have an output brightness greater than approximately 2300 candela.

16. The light source of claim 10 wherein the planar region of the heat sink has a first diameter, the heat sink comprises a rim having a maximum diameter, and the first diameter is less than approximately one-third of the maximum diameter.

17. The light source of claim 10 wherein the heat sink includes branching heat fins coupled between the planar region and the rim.

18. The light source of claim 10 wherein the plurality of LEDs comprise two strings of LEDs coupled in parallel with LEDs within a string coupled in series.

19. The light source of claim 10 wherein the heat sink is an MR16 form factor heat sink and the base is a GU5.3 compatible base.

\* \* \* \* \*